July 7, 1970 G. A. GILMOUR 3,519,885

TRANSIENT RADIATION HARDENING METHOD AND APPARATUS FOR ELECTRONICS CIRCUITRY

Filed June 20, 1966

WITNESSES

Theodore T. Wrobel

James F. Young

INVENTOR

George A. Gilmour

BY Ernest P. Klipfel

ATTORNEY

United States Patent Office 3,519,885

Patented July 7, 1970

3,519,885

TRANSIENT RADIATION HARDENING METHOD AND APPARATUS FOR ELECTRONICS CIRCUITRY

George A. Gilmour, Pittsburgh, Pa., assignor to Westinghouse Electric Corporation, Pittsburgh, Pa., a corporation of Pennsylvania Filed June 20, 1966, Ser. No. 558,860
Int. Cl. H02h 7/00
U.S. Cl. 317—33 10 Claims

ABSTRACT OF THE DISCLOSURE

Apparatus and method for transient radiation hardening of electronics circuitry wherein a time delay is provided in the input means and output means of the circuitry to be protected. The delay at the output of the electronics circuitry is removed and the delay at the input of the electronics circuitry is inserted a predetermined time after the occurrence of a nuclear detonation of sufficient intensity to affect the electronics circuitry.

The present invention relates generally to method and apparatus for protecting electronics equipment from malfunctioning due to nuclear transients.

It is desirable that electronics systems continue to perform their functions despite transient fields which may result from nuclear detonations. Such detonations may occur in commercial operations or may result from military action. It is apparent that guidance and fusing controls in military electronics systems must perform despite such transients.

An object of the present invention is to provide transient radiation hardening method and apparatus for getting a continuous signal through electronics gear that is temporarily knocked out of action.

Another object of the present invention is to provide method and apparatus for avoiding false signals induced into electronics circuitry by nuclear transients.

Briefly, the present invention accomplishes the above cited objects by providing a time delay in the input and output means of the electronics circuitry to be protected. The delay after the electronics circuitry is removed and the delay ahead of the electronics circuitry is inserted a predetermined time after the occurrence of a nuclear detonation of sufficient intensity to affect the electronics circuitry.

Figure 1:
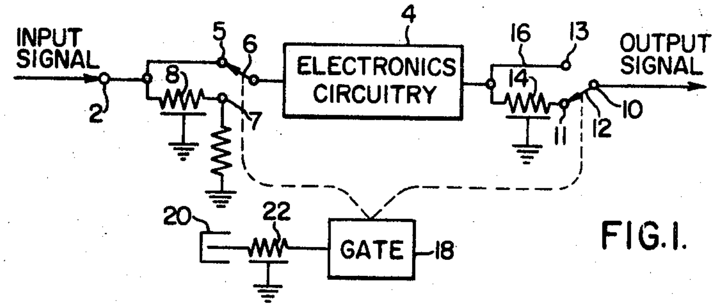
Figure 2:
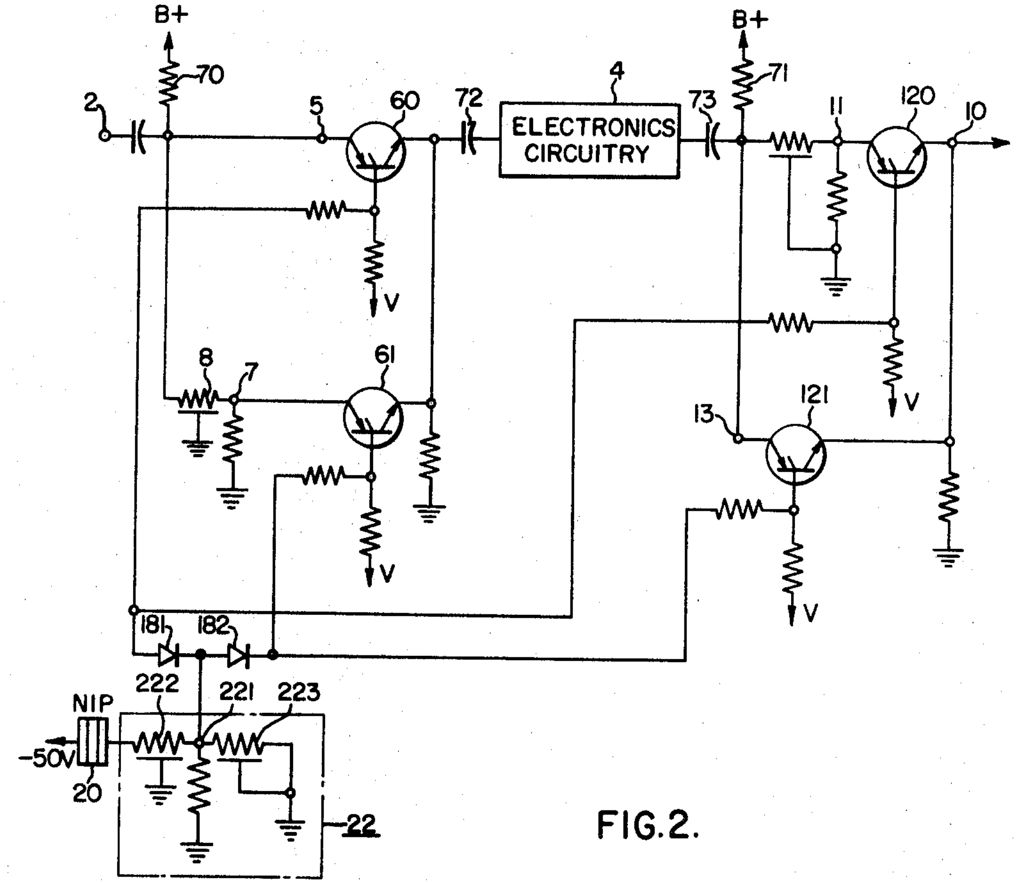

Further objects and advantages of the present invention will be readily apparent from the following detailed description taken in conjunction with the drawings in which:

FIG. 1 is a schematic block diagram of an illustrative embodiment of the present invention; and FIG. 2 is an electrical schematic diagram more particularly detailing electrical components for use in the illustrative embodiment of FIG. 1.

Assume a continuous input signal to the terminal 2. The input signal is connected to the electronics circuitry 4 by the switch 6. At the same time, the input signal enters a time delay 8 which stores the input signal for a time equal to the delay time for possible future use.

The output signal from the electronics circuitry 4 is connected to terminal 10 by switch 12 through a time delay 14. A conductive path 16 is positioned to bypass the time delay 14 when the switch 12 is activated in response to the gating circuit 18.

A radiation sensor 20 activates the gating circuit 18 a predetermined time after a nuclear detonation of sufficient intensity to affect the electronics circuitry 4. The predetermined time is established by a time delay 22.

In normal operation switches 6 and 12 are in the positions indicated by FIG. 1. The input signal is connected directly to the electronics circuitry 4. The output signal is delayed for a time T by the time delay 14.

Upon occurrence of a nuclear detonation of sufficient intensity to affect the electronics circuitry 4, the radiation sensor 20 emits a signal which is delayed for a time T by the delay line 22 to the gating circuitry 18. The gating circuitry 18 causes the switches 6 and 12 to disengage from terminals 5 and 11, respectively, and connect to terminals 7 and 3, respectively. The delay time T is chosen to be long enough for the electronics circuitry to recover from the transient, i.e. a few microseconds. Such time is representative of the recovery time of electronics circuitry for which this technique appears to be most valuable. In general the gamma radiation signal passes in approximately 0.1 microsecond. The problem is that the charge freed by this gamma signal has to be cleared out of transistors and the like at a rate compatible with the circuitry, i.e., a few microseconds. However, in principle the technique is unlimited as to the length of the time delay. With the switches 6 and 12 in their alternate positions, the input signal which has been stored in the delay line 8 is fed into the electronics circuitry 4 and the timing is corrected by the bypassing of delay line 14. The time delay T provided by each of the time delays 8, 14 and 22 is chosen to be substantially equal.

Hence, upon detonation of a nuclear explosion or the like, the radiation sensor 20 emits an enabling signal which is delayed by the time delay 22 for a time T sufficient to allow the circuitry to return to its normal operation. It is during this delay that the electronics circuitry 4 is malfunctioning, due to excessive charge induced by radiation or spurious electromagnetic fields. Outputs resulting from the malfunction of the electronics circuitry 4 are delayed however in the time delay 14 for a time T and are never emitted as an output signal since the switch 12 bypasses such stored spurious signals upon being activated by the gate 18 to connect instead to terminal 13. At the same time switch 12 is activated, switch 6 connects the time delay 8 to the electronics circuitry 4. Now the input signal which was stored in the time delay 8 for the period of time T is sent to the electronics circuitry for continuous operation, even though the electronics circuitry 4 was knocked out of action temporarily.

It is well known that certain time delays such as shielded delay lines are much more impervious to radiation transients than active electronics devices. Only the switch 12 for the time delay 14 must necessarily operate through the nuclear transient. This switch can be readily shielded from radiation, if necessary, and in a more economical manner than the radiation hardening of the electronics circuitry 4.

FIG. 2 illustrates a more detailed implementation wherein similar items have been assigned the same reference characters of FIG. 1. The mechanical switches 6 and 12, which might be reed relays, for example, are more particularly illustrated in FIG. 2 as semiconductor switches of the gate controlled type. That is, the switches 60, 61, 120 and 121 are chosen to be gate pulse triggered on-off switches of the GTO, GTS, trigistor or transwitch type. Of course, any switch capable of speedy operation may be utilized.

In normal operation the gate controlled switches 60 and 120 are in their conductive state while the switches 61 and 121 are in their nonconductive or open state. A negative polarity gate signal to the switches 60 and 120 will turn them off while a positive polarity gate signal to the switches 61 and 121 will turn them on. The negative polarity gating pulses are provided a slight instant prior to the positive polarity pulses so that the switches 60 and 120 will have an opportunity to clear out minority carriers which interfere with these switches assuming their nonconducting state.

To delay the ON gating pulses the time delay 22 is provided with a center tap 221. A first section 222 of the time delay 22 provides substantially all of the delay time necessary of the circuit 22. If it is assumed, however, that the gate controlled switches 60 and 120 require an additional 0.1 microsecond to get turned off because of the minority carriers, then that additional incrementive time for delaying the ON gating pulses is provided by section 223. The ON gating pulse, herein illustrated to be of positive polarity, will result from the enabling signal emitted from the radiation sensor 20 being reflected off the end of the shorted section of delay line and thereby assuming a positive polarity for gating the switches 61 and 121 to their conductive states through the diode 182. For sake of clarity, if all the time delays are assumed to provide a delay of time T equivalent to 5.0 microseconds than the negative polarity, OFF gating pulse through the diode 181 to the switches 60 and 120 will occur at 4.9 microseconds and the additional 0.1 microsecond delay for the positive polarity ON gating pulses provided by the shorted section 223 will occur at exactly 5.0 microseconds. Since 0.1 microsecond is assumed to be the time necessary to sweep out minority carriers, it can be seen that the switches 60, 61, 120 and 121 effectively change conductive states at the same time T.

Proper power supplies for the switches are provided through connecting resistors 70 and 71 to a B+ supply. The switches are biased to their normal operating condition by means of potential sources V connected to each of their gates. Coupling capacitors 72 and 73 isolate the DC levels required for switch biasing from the electronics circuitry 4.

The radiation detector 20 may be of any suitable type, a solid state PIN type being illustrated. The radiation sensor 20 emits a signal of sufficient magnitude to actuate the apparatus upon occurrence of a nuclear detonation of sufficient intensity to affect the electronics circuitry 4.

Thus, it is readily apparent that the present invention has provided method and apparatus for getting a continuous signal through electronics circuitry in spite of the occurrence of a harmful nuclear transient. At the same time, false signals induced into the electronics circuitry as a result of such transients are side tracked to avoid an undesirable output.

While the present invention has been described with a degree of particularity for the purposes of illustration, it is to be understood that all modifications, alterations and substitutions within the spirit and scope of the present invention are herein meant to be included.

I claim as my invention:

1. Transient radiation hardening apparatus for electronics circuitry comprising, in combination; first time delay means continually sampling the input signal to said electronics circuitry; second time delay means for delaying the output signal from said electronics circuitry; switching means for connecting said electronics circuitry to receive the input signal solely from said first time delay means and for bypassing the second time delay means; and radiation responsive time delay means for actuating said switching means.

2. The apparatus of claim 1 wherein each of said time delay means delays for substantially equal durations of time.

3. The apparatus of claim 1 wherein said swtiching means connects and bypasses simultaneously.

4. The apparatus of claim 1 wherein said first time delay means is shielded from radiation transients.

5. The apparatus of claim 1 including an output terminal for said electronics circuitry and wherein said switching means includes a first switch for connecting said input signal to said electronics circuitry; a second switch for connecting said first time delay means to said electronics circuitry; a third switch for connecting said second time delay means to said output terminal; and a fourth switch for connecting the output signal to said output terminal.

6. The apparatus of claim 5 wherein said first through fourth switches include gate pulse triggered on-off semiconductor switches.

7. The apparatus of claim 5 wherein said radiation responsive time delay means actuates said first and third switches to an open position and said second and fourth switches to a closed position.

8. The apparatus of claim 5 wherein said radiation responsive time delay means provides a first delay for pulsing the first and third switches off and a second delay for pulsing said second and fourth switches on, the second delay being of a duration sufficient to allow the first and third switches to be opened as the second and fourth switches are closed.

9. A transient radiation hardening method for electronics circuitry, comprising, in combination; sampling the input signal to said electronics circuitry and storing it for later use; delaying the output from said electronics circuitry; sensing a nuclear outburst of sufficient intensity to affect the electronics circuitry; and after a delay sufficient for the electronics circuitry to recover from the transient, connecting said electronics circuitry to receive the stored input signal and no longer delaying the output from said electronics circuitry.

10. The method of claim 9 including supplying a continuous signal to said electronics circuitry.

References Cited

UNITED STATES PATENTS

| | | | |
|---|---|---|---|
| 2,874,305 | 2/1959 | Wilson et al. | 250—83.6 |
| 2,924,720 | 2/1960 | Hamelink | 250—83.6 |
| 2,966,590 | 12/1960 | Dunham | 250—83.3 |
| 3,334,232 | 8/1967 | Merlen | 307—117 X |

JOHN F. COUCH, Primary Examiner

J. D. TRAMMELL, Assistant Examiner

U.S. Cl. X.R.

250—83.3; 307—117; 317—36